(12) United States Patent
Savariar-Hauck et al.

(10) Patent No.: US 8,846,299 B2
(45) Date of Patent: Sep. 30, 2014

(54) METHODS FOR PREPARING LITHOGRAHIC PRINTING PLATES

(75) Inventors: Celin Savariar-Hauck, Badenhausen (DE); Gerhard Hauck, Badenhausen (DE); Moshe Nakash, Ramat Hashron (IL)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/615,739

(22) Filed: Sep. 14, 2012

(65) Prior Publication Data

US 2013/0034815 A1 Feb. 7, 2013

Related U.S. Application Data

(63) Continuation-in-part of application No. 12/732,282, filed on Mar. 26, 2010, now abandoned.

(51) Int. Cl.
| | | |
|---|---|---|
| *B41M 5/00* | (2006.01) | |
| *B41N 1/00* | (2006.01) | |
| *G03F 7/00* | (2006.01) | |
| *G03F 7/26* | (2006.01) | |
| *G03F 7/32* | (2006.01) | |
| *B41N 3/08* | (2006.01) | |

(52) U.S. Cl.
CPC . *G03F 7/322* (2013.01); *B41N 3/08* (2013.01)
USPC ........ 430/302; 430/270.1; 430/294; 430/434; 101/450.1; 101/453

(58) Field of Classification Search
CPC .. B41C 1/00; B41C 2201/00; B41C 2210/99; B41C 2210/02; B41C 2210/06; B41C 2210/14; B41M 5/465; B41M 7/00; B41M 3/00; B41M 2205/00; B41N 1/00; B41N 1/05; B41N 2207/00; B41N 2210/00; G03F 7/0035; G03F 7/004
USPC ........................ 430/302, 434; 101/453, 463.1
See application file for complete search history.

(56) References Cited

U.S. PATENT DOCUMENTS

| | | | |
|---|---|---|---|
| 3,954,472 A | 5/1976 | Walls | |
| 4,308,340 A | 12/1981 | Walls | |
| 4,395,480 A | 7/1983 | Sprintschnik | |
| 4,492,747 A | 1/1985 | Brechlin | |
| 4,912,021 A | 3/1990 | Dhillon et al. | |
| 4,997,748 A | 3/1991 | Takeda et al. | |
| 6,100,016 A | 8/2000 | Denzinger et al. | |
| 6,365,330 B1 | 4/2002 | Leichsenring et al. | |
| 6,627,386 B2 | 9/2003 | Aoshima | |
| 7,563,556 B2 | 7/2009 | Savariar-Hauck et al. | |
| 7,582,407 B2 | 9/2009 | Savariar-Hauck et al. | |
| 2003/0113654 A1* | 6/2003 | Savariar-Hauck | 430/165 |
| 2007/0184192 A1 | 8/2007 | Bujard et al. | |
| 2009/0081583 A1* | 3/2009 | Loccufier et al. | 430/270.1 |
| 2009/0186301 A1* | 7/2009 | Ray et al. | 430/302 |
| 2009/0197052 A1 | 8/2009 | Levanon et al. | |
| 2009/0291387 A1 | 11/2009 | Levanon et al. | |
| 2009/0291395 A1* | 11/2009 | Savariar-Hauck et al. | 430/302 |
| 2010/0047723 A1 | 2/2010 | Levanon et al. | |
| 2010/0075255 A1* | 3/2010 | Taguchi | 430/284.1 |

FOREIGN PATENT DOCUMENTS

| | | |
|---|---|---|
| DE | 103 10 168 | 9/2004 |
| EP | 0 323 836 | 9/1994 |
| EP | 1 400 856 | 3/2004 |
| EP | 1 449 675 | 8/2004 |
| EP | 1 400 350 | 5/2008 |
| JP | 2003-107741 | 4/2003 |
| WO | 03/012550 | 2/2003 |
| WO | 2007/023336 | 3/2007 |

OTHER PUBLICATIONS

O'Neil, Maryadele J. et al. (2006,2012) The Merck Index—an Encyclopeida of Chemicals, Drugs, and Biologicals (14th Edition—Version 14.9). Merck Sharp & Dohme Corp., a subsidiary of Merck & Co., Inc. Online version available at: http://www.knovel.com/web/portal/browse/display?_EXT_KNOVEL_DISPLAY_bookid=1863&VerticalID=0.

* cited by examiner

*Primary Examiner* — Chanceity Robinson
(74) *Attorney, Agent, or Firm* — J. Lanny Tucker

(57) ABSTRACT

A lithographic processing solution has a pH of less than 12 and comprises at least 0.001 and up to and including 1 weight % of a water-soluble or water-dispersible, non-IR-sensitive compound that has a heterocyclic moiety with a quaternary nitrogen in the 1-position of the heterocyclic ring, and has one or more electron donating substituents attached to the heterocyclic ring, at least one of which electron donating substituents is attached in the 2-position. This processing solution can be used to develop both single-layer and multi-layer positive-working lithographic printing plate precursors that have been imaged using infrared radiation.

17 Claims, No Drawings

METHODS FOR PREPARING LITHOGRAHIC PRINTING PLATES

CROSS-REFERENCE TO RELATED APPLICATIONS

This is a Continuation-in-part application U.S. Ser. No. 12/732,282 filed Mar. 26, 2010, entitled "Lithographic Processing Solutions and Methods of Use" by Celin Savariar-Hauck, et al., now abandoned.

FIELD OF THE INVENTION

This invention relates to a method of providing imaged and processed elements such as lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital or thermal imaging has become increasingly important in the printing industry because of their stability to ambient light. The imageable elements for the preparation of lithographic printing plates have been designed to be sensitive to heat or infrared radiation and can be exposed using thermal heads of more usually, infrared laser diodes that image in response to signals from a digital copy of the image in a computer a platesetter. This "computer-to-plate" technology has generally replaced the former technology where masking films were used to image the elements.

These imaging techniques require the use of alkaline developers to remove exposed (positive-working) or non-exposed (negative-working) regions of the imaged layer(s). In some instances of positive-working lithographic printing plate precursors that are designed for IR imaging, compositions comprising infrared radiation-sensitive absorbing compounds (such as IR dyes) inhibits and other dissolution inhibitors make the coating insoluble in alkaline developers and soluble only in the IR-exposed regions.

To enable good solubility in an alkaline developer, one must use a polymeric binder in the imageable layer that is highly soluble the alkaline developer in order to generate a significant difference between the solubility of the non-exposed regions and that of the exposed regions in the alkaline developer. This, however, makes the image more susceptible to developer attack and less resistant to scratches during handling.

Therefore substances that function as image protecting agents, often referred to as dissolution inhibitors, are well known and are commonly used in high pH developers (pH greater than 13) for positive-working lithographic printing plate precursors, many of which are commercially available in the industry. Such printing plate precursors generally include phenolic polymeric binders in the outermost imageable layers. The interaction of the dissolution inhibitors with phenolic groups in the polymeric binders gives good protection of the non-exposed (imaged) regions while exposed (non-image) regions are selectively and readily removed. Polymeric binders having pendant carboxylic acids can also interact with dissolution inhibitors but the interaction are weaker and less useful.

Lower pH developers (pH less than 12) are generally used to process imaged negative-working lithographic printing plate precursors that contain polycondensed diazonium salts or free radical polymerizable polymers in the imageable layer. Such imageable layer can also include polymeric binder having carboxylic groups. There is good differential in solubility between the imaged (exposed) where generally a crosslinking or fusing of particles takes place and non-image (non-exposed) regions, making it unnecessary for the solubility suppressing or dissolution inhibitors in the coating to protect the image.

U.S. Pat. No. 7,582,407 (Savariar-Hauck et al.) and U.S. Pat. No. 7,563,556 (Savariar-Hauck et al.) describe the use of phenolic polymeric binders in positive-working lithographic printing plate precursors that can be processed using low pH developers. To avoid the buildup of sludge in the processing bath, the imageable layers are designed to dissolve completely in the alkaline developer but the resulting image is susceptible to damage from the developer. The dissolution inhibitors mentioned above are not very effective as image protecting agents because the low pH developers generally include alkanolamines, organic solvents, and hydrotropic agents that tend to hinder the interaction of the dissolution inhibitors with phenolic groups of the polymeric binders. These developers can also contain N-alkoxylated or quaternary amines as described in DE 10 310 168 and 19 845 605.

High pH developers can also include various development inhibitors including polyalkyeneoxides and quaternary ammonium salts, as described for example in WO 2003/012550 (Fiebag et al.) Amphoteric dissolution inhibitors are described in WO 2007/023336 (Fiebag et al.). Other high pH developers include poly(vinyl pyrrolidone) as described for example, in EP 323,836A1 (Toyama et al.) and EP 1,449, 675A1 (Hauck et al.), or N-heterocyclic compounds as described for example, in DE 3,927,693 (Takeda et al.).

However, generally the activity of high pH developers is difficult to maintain because of neutralization that occurs over time as imaged precursors are developed or from atmospheric carbon dioxide, and thus they must be carefully monitored to enable steady performance. Furthermore, the silicates in such developers can react undesirably with the aluminum support or minerals in the water to form sludge that can clog the plumbing and components of processor equipment.

There remains a need for a way to develop IR-exposed positive-working lithographic printing plate precursors in low pH developers without the disadvantages of high pH developers, but making use of the solubility suppressing agents that are commonly used in high pH developers to provide image protection. It would be particularly desirable to process precursors that include phenolic polymeric binders in the outermost imageable layer that are designed to be soluble in low pH developers.

SUMMARY OF THE INVENTION

The present invention provides a method for using a lithographic processing solution for processing infrared radiation-sensitive, positive-working lithographic printing plate precursors, the lithographic processing solution having a pH of 12 or less and comprising at least 0.001 weight % and up to and including 1 weight % of a water-soluble or water-dispersible, non-IR-sensitive compound that has a heterocyclic moiety with a quaternary nitrogen in the 1-position of the heterocyclic ring, and having one or more electron donating substituents attached to the heterocyclic ring, at least one of which electron donating substituents is attached in the 2-position.

In some embodiments, the processing solution has a pH of from 8.5 to 11.5, and comprising from about 0.1 to about 0.8 weight % of one or more of Thioflavin T, Astrazon Orange R, and Basic Violet 16 (all defined below),
the processing solution being essentially free of silicates and metasilicates, and further comprising from about 0.1 to about 5 weight % of an alkanolamine, organic phosphonic acid or polycarboxylic acid or salt thereof that is different from an anionic surfactant, an anionic or nonionic surfactant, or a hydrophilic film-forming polymer, or mixtures thereof.

In addition, a method of this invention provides a lithographic printing plate comprising:
A) imagewise exposing a positive-working, infrared radiation-sensitive lithographic printing plate precursor having a hydrophilic substrate and surface layer comprising a phenolic polymeric binder, to provide exposed and non-exposed regions in the surface layer, and
B) processing the imagewise exposed precursor with the processing solution of this invention to remove the exposed regions of the surface layer, thereby providing a lithographic printing plate.

In some embodiments, the method of this invention further comprises:
C) mechanically removing excess processing solution from the lithographic printing plate after steps A and B, with optional drying, and optionally,
D) without removing the protective coating, using the lithographic printing plate after step C for printing an image using a lithographic printing ink.

The present invention provides useful low pH developers that provide good processing as well as image protection. These developers can be used to process both imaged single- and multi-layer, positive-working lithographic printing plate precursors, and especially precursors that have phenolic polymeric binders in the outermost or surface layer. These advantages are provided by the incorporation of certain additives into the low pH developers, which additives are water-soluble or water-dispersible, non-IR-sensitive compounds that have a heterocyclic moiety with a quaternary nitrogen in the 1-position of the heterocyclic ring, and one or more electron donating substituents attached to the heterocyclic ring. At least one of these electron donating substituents is attached in the 2-position of the heterocyclic moiety. It is believed that these compounds adhere strongly to the coating surface thus giving the image the desired protection.

This is especially remarkable due to the improvement achieved in the developing latitude by using the present invention. These additives do not slow down the development speed (see Drop Test in the Examples) or the precursor sensitivity, and maintain the tonal values in a soak test (showing image developer resistance).

DETAILED DESCRIPTION OF THE INVENTION

Definitions

Unless the context indicates otherwise, when used herein, the terms "developer", "processing solution", "developing solution", "lithographic printing plate precursor", and "printing plate precursor" are meant to be references to embodiments of the present invention.

The term "single-layer" lithographic printing plate precursor refers to elements having a single imageable layer that is disposed directly on the hydrophilic substrate, which can have various primer or other treatments to provide hydrophilicity.

The term "multi-layer" lithographic printing plate precursor refers to elements having at least two imageable layers, and generally only two imageable layers, including an inner layer and a surface (outer) layer.

In addition, unless the context indicates otherwise, the various components described herein such as the "additive" compounds in the developer or processing solution, "infrared radiation absorbing compound", "phenolic polymeric binder", and similar terms also refer to mixtures of such components. Thus, the use of the articles "a", "an", and "the" is not necessarily meant to refer to only a single component.

Moreover, unless otherwise indicated, percentage refers to percent by total dry weight, for example, weight % based on total solids of either an imageable layer or imageable layer composition or formulation. Unless otherwise indicated, the percentages can be the same for either the dry imageable layer or the total solids of a layer composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The terms "polymer" and "polymeric binder" refer to high and low molecular weight polymers including oligomers, homopolymers, and copolymers, which are defined for this invention to have a molecular weight of at least 500.

The term "copolymer" refers to polymers that have two or more different recurring units.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Positive-working Lithographic Printing Plate Precursors

The lithographic printing plate precursors used in the practice of this invention are positive-working and include one or more layers disposed on a suitable substrate that has a hydrophilic surface or at least a surface that is more hydrophilic than the applied imageable layer on the imaging side.

The substrate comprises a support that can be composed of any material that is conventionally used to prepare lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of from about 1.5 to about 5 $g/m^2$ and more typically from about 3 to about 4.3 $g/m^2$. Phosphoric acid anodization generally provides an oxide weight on the surface of from about 1.5 to about 5 $g/m^2$ and more typically from about 1 to about 3 $g/m^2$. When sulfuric acid is used for anodization, higher oxide weight (at least 3 $g/m^2$) can provide longer press life.

The aluminum support can also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support can be treated with a phosphate solution that can further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 µm and up to and including 700 µm.

The backside (non-imaging side) of the substrate can be coated with antistatic agents and/or slipping layers or a matte layer to improve handling and "feel" of the imageable element.

The substrate can also be a cylindrical surface having the imageable layer thereon, and thus be an integral part of the printing press. The use of such imaging cylinders is described for example in U.S. Pat. No. 5,713,287 (Gelbart).

Some embodiments of such positive-working lithographic printing plate precursors comprise a single imageable surface layer while others comprise an inner layer and an outer surface layer disposed on the inner layer.

The lithographic printing plate precursors processed using the invention can also be single- or multi-layer, thermally-sensitive, positive-working imageable elements that generally rely on an infrared radiation absorbing compound dispersed within one or more polymeric binders that, upon suitable irradiation, are soluble, dispersible, or removable in processing solutions including alkaline developers. Thus, the imageable layer(s), upon irradiation, undergoes a change in solubility properties with respect to the processing solution in its irradiated (exposed) regions.

For example, "single-layer" positive-working lithographic printing plate precursors are described for example, in EP 1,543,046 (Timpe et al.), WO 2004/081662 (Memetea et al.), U.S. Pat. No. 6,255,033 (Levanon et al.), U.S. Pat. No. 6,280,899 (Hoare et al.), U.S. Pat. No. 6,391,524 (Yates et al.), U.S. Pat. No. 6,485,890 (Hoare et al.), U.S. Pat. No. 6,558,869 (Hearson et al.), U.S. Pat. No. 6,706,466 (Parsons et al.), U.S. Pat. No. 6,541,181 (Levanon et al.), U.S. Pat. No. 7,223,506 (Kitson et al.), U.S. Pat. No. 7,247,418 (Saraiya et al.), U.S. Pat. No. 7,270,930 (Hauck et al.), U.S. Pat. No. 7,279,263 (Goodin), and U.S. Pat. No. 7,399,576 (Levanon), EP 1,627,732 (Hatanaka et al.), and U.S. Published Patent Applications 2005/0214677 (Nagashima), 2004/0013965 (Memetea et al.), 2005/0003296 (Memetea et al.), and 2005/0214678 (Nagashima).

If there is a single imageable layer in the lithographic printing plate precursor, this surface layer contains one or more phenolic polymeric binders that are generally soluble in alkaline developers (defined below) after thermal imaging. In most embodiments of the lithographic printing plate precursors, these polymeric binders are present in an amount of at least 10 weight % and typically from about 20 to about 80 weight % of the total dry imageable layer weight. By "phenolic", we mean a hydroxyl-substituted phenyl group.

Useful phenolic polymers include but are not limited to, poly(vinyl phenols) or derivatives thereof. They can also include pendant acidic groups such as carboxylic (carboxy), sulfonic (sulfo), phosphonic (phosphono), or phosphoric acid groups that are incorporated into the polymer molecule or pendant to the polymer backbone. Other useful additional phenolic polymers include but are not limited to, novolak resins, resole resins, poly(vinyl acetals) having pendant phenolic groups, and mixtures of any of these resins (such as mixtures of one or more novolak resins and one or more resole resins). Generally, such resins have a number average molecular weight of at least 3,000 and up to 200,000, and typically from about 6,000 to about 100,000, as determined using conventional procedures. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or a m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful additional resins include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.), 2005/0051053 (Wisnudel et al.), and 2008/2008/0008956 (Levanon et al.). For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of from about 1,000 to about 30,000. In addition, they can have a polydispersity less than 2. The branched poly(hydroxystyrenes) can be homopolymers or copolymers with non-branched hydroxystyrene recurring units.

Another group of useful polymeric binders are poly(vinyl phenol) and derivatives thereof. Such polymers are obtained generally by polymerization of vinyl phenol monomers, that is, substituted or unsubstituted vinyl phenols. Some vinyl phenol copolymers are described in EP 1,669,803A (Barclay et al.).

Additional polymeric binders that can be in the layer with the phenolic binder include phenolic resins such as novolak and resole resins that include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.).

The single-layer, positive-working lithographic printing plate precursor also includes one or more radiation absorbing compounds in the surface imageable layer. Such compounds are sensitive to near-infrared or infrared radiation, for example of from about 700 to about 1400 nm and typically from about 700 to about 1200 nm.

Useful IR-sensitive radiation absorbing compounds include carbon blacks and other IR-absorbing pigments and various IR-sensitive dyes ("IR dyes"). Examples of suitable IR dyes include but are not limited to, azo dyes, squarilium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Drano et al.), U.S. Pat. No. 6,264,920 (Achilefu et al.), U.S. Pat. No. 6,309,792 (Hauck et al.), and U.S. Pat. No. 6,787,281 (Tao et al.), and EP 1,182,033A2 (noted above). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

Some useful IR cyanine dyes include a borate anion, such as a tetra-substituted borate anion, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

Useful radiation absorbing compounds can be obtained from a number of commercial sources or they can be prepared using known starting materials and procedures.

The radiation absorbing compound (or sensitizer) can be present in the imageable layer in an amount generally of at least 0.5% and up to and including 30% and typically at least 3 and up to and including 20%, based on total solids. The particular amount needed for this purpose would be readily apparent to one skilled in the art, depending upon the specific compound used to provide the desired chromophore.

In some embodiments, the IR radiation absorbing compound is present in the single surface imageable layer. Alternatively or additionally, the IR radiation absorbing compounds can be located in a separate layer that is in thermal contact with the single surface imageable layer. Thus, during imaging, the action of the IR radiation absorbing compound can be transferred to the single surface imageable layer without the compound originally being incorporated into it.

In addition, solubility-suppressing components are optionally incorporated into the single surface imageable layer. Such components act as dissolution inhibitors that function as solubility-suppressing components for the polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetraalkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The single surface imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

The single-layer surface imageable element can be prepared by applying the layer formulation to the substrate (including any hydrophilic layers on an aluminum sheet or cylinder) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single surface imageable layer can be from about 0.5 to about 2.5 $g/m^2$ and typically from about 1 to about 2 $g/m^2$.

The selection of solvents used to coat the surface imageable layer formulation depends upon the nature of the polymeric materials and other components in the formulations. Generally, the formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art. The coated layer can be dried in a suitable manner.

Other positive-working lithographic printing plate precursors used in this invention are multi-layer imageable elements comprise a substrate, an inner layer (also known in the art as an "underlayer"), and an outer surface layer (also known in the art as a "top layer" or "topcoat") disposed over the inner layer. Before thermal imaging, the outer layer is generally not soluble or removable by an alkaline developer within the usual time allotted for development, but after thermal imaging, the exposed regions of the outer surface layer are soluble in the alkaline developer. The inner layer is also generally removable by the alkaline developer. An infrared radiation absorbing compound (described above) can also be present in such imageable elements, and is typically present in the inner layer but can optionally be in a separate layer between the inner and outer layers. Useful IR radiation absorbing compounds are described above.

Thermally imageable, multi-layer lithographic printing plate precursors are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), U.S. Pat. No. 6,528,228 (Savariar-Hauck et al.), U.S. Pat. No. 7,163,770 (Saraiya et al.), U.S. Pat. No. 7,163,777 (Ray et al.), U.S. Pat. No. 7,186,482 (Kitson et al.), U.S. Pat. No. 7,223,506 (noted above), U.S. Pat. No. 7,229,744 (Patel), U.S. Pat. No. 7,241,556 (Saraiya et al.), U.S. Pat. No. 7,247,418 (noted above), U.S. Pat. No. 7,291,440 (Ray et al.), U.S. Pat. No. 7,300,726 (Patel et al.), and U.S. Pat. No. 7,338,745 (Ray et al.), U.S. Patent Application Publications 2004/0067432 A1 (Kitson et al.) and 2005/0037280 (Loccufier et al.).

These multi-layer lithographic printing plate precursors are formed by suitable application of an inner layer composition onto a suitable substrate. This substrate can be an untreated or uncoated support but it is usually treated or coated in various ways as described above prior to application of the inner layer composition. The substrate generally has a hydrophilic surface or at least a surface that is more hydrophilic than the outer layer composition. The substrate comprises a support that can be composed of any material that is conventionally used to prepare lithographic printing plates. Further details of such substrates are provided above in relation to the single-layer precursors.

The inner layer is disposed between the outer surface layer and the substrate. Typically, it is disposed directly on the substrate (including any hydrophilic coatings as described above). The inner layer comprises a first polymeric binder that is removable by the lower pH processing solution of this invention and typically soluble in that processing solution to reduce sludging. In addition, the first polymeric binder is usually insoluble in the solvent used to coat the outer surface layer so that the outer surface layer can be coated over the inner layer without dissolving the inner layer. Mixtures of these first polymeric binders can be used if desired in the inner layer. Such polymeric binders are generally present in the inner layer in an amount of at least 10 weight %, and generally from about 60 to 95 weight % of the total dry inner layer weight.

Useful polymeric binders for the inner layer include (meth) acrylonitrile polymers, (meth)acrylic resins comprising carboxy groups, polyvinyl acetals, maleated wood rosins, styrene-maleic anhydride copolymers, (meth)acrylamide polymers including polymers derived from N-alkoxyalkyl methacrylamide, polymers derived from an N-substituted cyclic imide, polymers having pendant cyclic urea groups, and combinations thereof. Still other useful polymeric binders are derived from an N-substituted cyclic imide (especially N-phenylmaleimide), a (meth)acrylamide (especially methacrylamide), a monomer having a pendant cyclic urea group, and a (meth)acrylic acid (especially methacrylic acid). Polymeric binders of this type include copolymers that comprise from about 20 to about 75 mol % and typically about 35 to about 60 mol % or recurring units derived from N-phenylmaleimide, N-cyclohexyl-maleimide, N-(4-carboxyphenyl)maleimide, N-benzylmaleimide, or a mixture thereof, from about 10 to about 50 mol % of recurring units derived from acrylamide, methacrylamide, or a mixture thereof, and from about 5 to about 30 mol % of recurring units derived from methacrylic acid. Other hydrophilic monomers, such as hydroxyethyl methacrylate, N-methoxymethyl (alkyl)acrylamides, and alkoxymethyl (alkyl)acrylates can be used in place of some or all of the methacrylamide. Other alkaline soluble monomers, such as acrylic acid, methacrylic acid, itaconic acid, and monomers having pendant 1H-tetrazole groups can be used in place of some or all of the methacrylic acid. Optionally, these polymers can also include recurring units derived from (meth)acrylonitrile or N-[2-(2-oxo-1-imidazolidinyl)ethyl]-methacrylamide.

Still other useful polymeric binders in the inner layer can comprise, in polymerized form, from about 5 mol % to about 30 mol % of recurring units derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % of recurring units derived from N-phenylmaleimide, N-cyclohexylmaleimide, or a mixture thereof, optionally, from about 5 mol % to about 50 mol % of recurring units derived from methacrylamide, and from about 3 mol % to about 50 mol % one or more recurring units derived from monomer compounds of the following Structure:

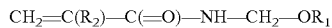

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl, as described for example in U.S. Pat. No. 7,186,482 (Kitson et al.). Methods of preparation of certain of these polymeric materials are disclosed in U.S. Pat. No. 6,475,692 (Jarek).

Additional useful polymeric binders for the inner layer are described for example, in U.S. Pat. Nos. 7,144,661 (Ray et al.), U.S. Pat. No. 7,163,777 (Ray et al.), and U.S. Pat. No. 7,223,506 (Kitson et al.), and U.S. Patent Application Publications 2006/0257764 (Ray et al.) and 2007/0172747 (Ray et al.).

The polymeric binders can comprise more than 50% and up to 100% (dry weight) of the total polymeric materials in the inner layer. Still other useful polymeric materials include copolymers that comprises from about 1 to about 30 mole % of recurring units derived from N-phenylmaleimide, from about 1 to about 30 mole % of recurring units derived from methacrylamide, from about 20 to about 75 mole % of recurring units derived from acrylonitrile, and from about 20 to about 75 mole % of recurring units derived from one or more monomers of the following Structure:

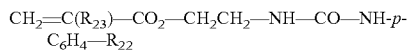

wherein $R_{22}$ is OH, COOH, or $SO_2NH_2$, and $R_{23}$ is H or methyl, and, optionally, from about 1 to about 30 mole % from about 3 to about 20 mole % of recurring units derived from one or more monomers of the following Structure:

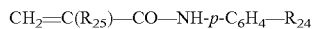

wherein $R_{24}$ is OH, COOH, or $SO_2NH_2$, and $R_{25}$ is H or methyl.

Still other useful polymeric binders for the inner layer are polymers having pendant 1H-tetrazole groups as described for example in U.S. Patent Application Publication 2009-0142695 (Baumann et al.). Such polymeric binders can have recurring units providing a carbon-carbon backbone derived from one or more ethylenically unsaturated polymerizable monomers, and the 1H-tetrazole groups can be attached to the backbone through a linking group L comprising a —C(=O)—NR$^1$—, —NR$^1$—, —NR$^1$—(C=O)—NR$^2$—, —S—, —COO(=O)—, or —CH=N— group, or a combination thereof. Particularly useful linking groups include —C(=O)—NR$^1$— and —NR$^1$—(C=O)—NR$^2$—. The noted linking groups can be directly attached to the backbone or attached through an organic group having up to 30 atoms in the linking chain. These polymers can also have recurring units derived, for example, from one or more allyl (meth)acrylates, alkyl (meth)acrylates, hydroxyalkyl (meth)acrylates, (meth)acrylamides that can be substituted by alkyl or aryl groups, (meth)acrylates of polyethylene oxide or propylene oxide, (meth)acrylonitriles, styrene or styrene derivatives, vinyl acetate, vinyl carbazole, vinyl pyrrolidone, vinyl alcohol, N-substituted maleimides, or half esters of ring-opened maleic acid anhydrides.

The inner layer can also comprise one or more secondary polymeric materials that are resins having activated methylol and/or activated alkylated methylol groups. The secondary polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical). The resin having activated methylol and/or activated alkylated methylol groups is typically a resole resin or a mixture of resole resins. They are prepared by reaction of a phenol with an aldehyde under basic conditions using an excess of phenol. Useful secondary additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These copolymers are disclosed in U.S. Pat. No. 6,294,311 (Shimazu et al.) and U.S. Pat. No. 6,528,228 (Savariar-Hauck et al.).

In most embodiments, the inner layer further comprises an infrared radiation absorbing compound (as described above) that absorbs radiation at from about 700 to about 1400 and typically at from about 700 to about 1200 nm. In most embodiments, the infrared radiation absorbing compound is present only in the inner layer. The infrared radiation absorbing compound can be present in the multi-layer lithographic printing plate precursor in an amount of generally at least 0.5% and up to 30% and typically from about 3 to about 25%, based on the total dry weight of the layer in which the compound is located. The particular amount of a given compound to be used could be readily determined by one skilled in the art.

The inner layer can include other components such as surfactants, dispersing aids, humectants, biocides, viscosity builders, drying agents, defoamers, preservatives, antioxidants, colorants, or organic or inorganic particles.

The inner layer generally has a dry coating coverage of from about 0.5 to about 2.5 g/m$^2$ and typically from about 1 to about 2 g/m$^2$. The total polymeric binders described above generally comprise at least 50 weight % and typically from about 60 to about 90 weight % based on the total dry layer weight, and this amount can be varied depending upon what other polymers and chemical components are present.

The outer surface layer of the imageable element is disposed over the inner layer and in most embodiments there are no intermediate layers between the inner and outer surface layers. The outer surface layer comprises a second polymeric binder that is usually different than the first polymeric binder described above for the inner layer. This second polymeric binder is a phenolic polymeric binder as described above for the single-layer lithographic printing plate precursor. In many embodiments, the outer surface layer is substantially free of infrared radiation absorbing compounds, meaning that none of these compounds are purposely incorporated therein and insubstantial amounts diffuse into it from other layers. However, in other embodiments, the infrared radiation absorbing compound can be in both the outer surface and inner layers, as described for example in EP 1,439,058A2 (Watanabe et al.) and EP 1,738,901A1 (Lingier et al.), or in an intermediate layer as described above.

The one or more second phenolic polymeric binders are present in the outer surface layer at a dry coverage of from about 15 to 100 weight %, typically from about 70 to about 98 weight %, based on total dry weight of the outer surface layer.

The outer surface layer can also include colorants as described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element. The outer surface layer can optionally also include contrast dyes, printout dyes, coating surfactants, dispersing aids, humectants, biocides, viscosity builders, drying agents, defoamers, preservatives, and antioxidants.

The outer surface layer generally has a dry coating coverage of from about 0.2 to about 2 $g/m^2$ and typically from about 0.3 to about 1 $g/m^2$.

There can be a separate layer that is between and in contact with the inner and outer surface layers. This separate layer can act as a barrier to minimize migration of infrared radiation absorbing compound(s) from the inner layer to the outer surface layer. This separate "barrier" layer generally comprises other polymeric binders that are soluble in the processing solution. If this polymeric binder is different from the first polymeric binder(s) in the inner layer, it is typically soluble in at least one organic solvent in which the inner layer first polymeric binders are insoluble. A useful polymeric binder for this purpose is a poly(vinyl alcohol). Generally, this barrier layer should be less than one-fifth as thick as the inner layer, and typically less than one-tenth as thick as the inner layer.

The multi-layer lithographic printing plate precursors can be prepared by sequentially applying an inner layer formulation over the surface of the hydrophilic substrate, and then applying an outer layer formulation over the inner layer using conventional coating or lamination methods. It is important to avoid intermixing of the inner and outer surface layer formulations.

The inner and outer surface layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support.

The selection of solvents used to coat both the inner and outer surface layers depends upon the nature of the first and second polymeric binders, other polymeric materials, and other components in the formulations. To prevent the inner and outer surface layer formulations from mixing or the inner layer from dissolving when the outer surface layer formulation is applied, the outer surface layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer surface layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer surface layers can be applied by extrusion coating methods from melt mixtures of the respective layer compositions. Typically, such melt mixtures contain no volatile organic solvents.

Intermediate drying steps can be used between applications of the various layer formulations to remove solvent(s) before coating other formulations. Drying steps can also help in preventing the mixing of the various layers.

After drying the layers, the lithographic printing plate precursors can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the lithographic printing plate precursors are wrapped or encased in a water-impermeable sheet material to represent an effective barrier to moisture removal from the precursors, or the heat treatment of the precursors is carried out in an environment in which relative humidity is controlled to at least 25%. In addition, the water-impermeable sheet material can be sealed around the edges of the precursors, with the water-impermeable sheet material being a polymeric film or metal foil that is sealed around the edges of the precursors.

In some embodiments, this heat treatment can be carried out with a stack comprising at least 100 of the same lithographic printing plate precursors, or when the precursor is in the form of a coil or web. When conditioned in a stack, the individual precursors can be separated by suitable interleaving papers. The interleaving papers can be kept between the imageable elements after conditioning during packing, shipping, and use by the customer.

Imaging Conditions

The lithographic printing plate precursors can have any useful form and size or shape including but not limited to, printing plates, printing cylinders, printing sleeves (both hollow or solid), and printing tapes (including flexible printing webs).

During use, the positive-working lithographic printing plate precursors are exposed to a suitable source of imaging or exposing radiation at a wavelength of from about at a wavelength of at least 750 nm and up to and including about 1400 nm and typically at least 700 nm and up to and including 1200 nm using an appropriate laser or array of lasers. Imaging can be carried out using IR imaging radiation at multiple wavelengths at the same time if desired.

The laser used to expose the imageable element is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can function solely as a platesetter or it can be incorporated directly into a lithographic printing press. In the latter case, printing can commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful near-infrared and infrared imaging apparatus is available as models of Creo Trendsetter or Creo Quantum 800 imagesetters available from Eastman Kodak Company (Burnaby, British Columbia, Canada) that contain laser diodes that emit near infrared radiation at a wavelength of about 830 nm. Other suitable imaging sources include the Crescent 42T platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of infrared radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the lithographic printing plate precursor.

Development and Printing

With or without the need for a preheat step after imaging, the imaged lithographic printing plate precursors can be developed "off-press" using conventional processing and the processing solution of this invention.

The processing solution used for this development has a pH of 12 or less, and that can be as low as 7. Typically, the pH is from 8 to 12 or from 8.5 to 11.5.

This processing solution includes at least 0.001 weight % and up to and including 1 weight % of a water-soluble or water-dispersible, non-IR-sensitive compound that has a heterocyclic moiety with a quaternary nitrogen in the 1-position of the heterocyclic ring. This compound also has one or more electron donating substituents attached to the heterocyclic ring, at least one of which electron donating substituents is attached in the 2-position. The amount of these compounds can be from 0.1 to 0.8 weight %. These compounds are sometimes identified herein as "additives" for the processing solution.

More specifically, the water-soluble or water-dispersible compounds have a dialkylaminophenyl or 3-iridolyl group in the 2-position of the heterocyclic ring. Examples of such compounds include but are not limited to, Thioflavin T (product name, also known as Basic Yellow 1, CAS 2390-54-7) that has a chemical name of 4-(3,5-dimethyl-1,3-benzothiazol-3-ium-2-yl)-N,N-dimethylaniline chloride, Astrazon Orange G (product name, also known as Basic Orange 21, CAS 88289-17-2) that has a chemical name of 1,3,3-trimethyl-2-[(E)-2-(2-methyl-1H-indol-3-yl)-ethylenyl]-3H-indolium chloride, and Basic Violet 16 (product name, also known as Cationic Red 2B or Cationic Red 2R, CAS 6359-45-1) that has a chemical name of 2-{(E)-2-[4-(diethylamino)phenyl]ethenyl}-1,3,3-trimethyl-3H-indolium chloride.

In addition, the processing solution can further comprise one or more of the following: anionic or nonionic surfactants, alkanolamines, organic solvents, organic phosphonic acids or polycarboxylic acids or salts thereof that are different from the anionic surfactant, and hydrophilic film-forming polymers.

For example, the processing solution can comprise at least 0.01 weight % of an alkanolamine (such as diethanolamine, triethanolamine, and monoethanolamine, or mixtures thereof), an organic phosphonic acid or polycarboxylic acid or salt thereof that is different from the anionic surfactant, or a hydrophilic film-forming polymer.

In addition, the processing solution can also comprises up to and including 8 weight % (based on total processing solution weight) of one or more organic solvents (described below). Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol.

The processing solution of this invention is free of silicates and metasilicates, meaning that none of these compounds is intentionally added to the processing solution.

In some embodiments, the processing solution has a pH of from 8.5 to 11.5, and comprises from about 0.1 to about 0.8 weight % of one or more of Thioflavin T, Astrazon Orange G, and Basic Violet 16 (defined above), and the processing solution is essentially free of silicates and metasilicates, and further comprising from about 0.1 to about 5 weight % of an alkanolamine, organic phosphonic acid or polycarboxylic acid or salt thereof that is different from an anionic surfactant, or hydrophilic film-forming polymer, or mixtures thereof.

The processing solution can further include one or more surfactants that can act as "coating-attack suppressing agents" that are developer-soluble compounds that suppress developer attack of the outer layer in addition to the additives used according to this invention. "Developer-soluble" means that enough of the agent(s) will dissolve in the processing solution to suppress attack by the processing solution. Typically, the coating-attack suppressing agents are developer-soluble polyethoxylated, polypropoxylated, or polybutoxylated compounds that include recurring —(CH$_2$—CHR$_a$—O—)— units in which R$_a$ is hydrogen or a methyl or ethyl group. Representative compounds of this type include but are not limited to, polyglycols and polycondensation products having the noted recurring units. Examples of such compounds and representative sources, tradenames, or methods of preparing are described for example in U.S. Pat. No. 6,649,324 (Fiebag et al.).

Some of the processing solutions of this invention can be formulated by taking a commercial organic solvent-containing alkaline developer and adding one or more non-IR sensitive compounds described above in suitable amounts. Developers that can be used in this manner include but are not limited to, ND-1 Developer, 955 Developer, 956 Developer, 989 Developer, Developer 980, and 956 Developer (available from Eastman Kodak Company), HDN-1 Developer and LP-DS Developer (available from Fuji Photo), and EN 232 Developer and PL10 Developer (available from Agfa). Some of these commercial developers include up to 20 weight % of one or more organic solvents such as phenoxy ethanol as others described above, as well as organic amines such as alkanolamines.

Other useful processing solutions of this invention can be prepared by mixing an "additive" as described above in silicate-free carbonate processing solutions as described for example in U.S. Patent Application Publication 2009-0197052 (Levanon et al.) that is incorporated herein by reference. Similarly, the "additive" can be mixed with carbonate processing solutions containing organic solvents, organic amines, anionic surfactants, or combinations thereof, as described for example in U.S. Patent Application Publications 2009-0291387 (Levanon et al.) and 2010-0047723 (Levanon et al.), both of which are incorporated herein by reference. Useful organic amines include those whose conjugated acids have a pKa greater than 9 and a boiling point greater than 150° C. Such organic amines may be present in an amount of at least 0.03 N or from 0.03 to 1.5 N, and include ethanol amine, 4-aminopyridine, 1,5-diaminopentane, 4-(2-aminoethyl)phenol, 1-ephedrine, 2-(ethylamino)ethanol, 3-amino-1-propanol, and 2-(2-aminoethylamino)ethanol. Further details are provided in the noted US '723 publication.

In some embodiments, the processing solution of this invention consists essentially of a carbonate, organic solvent, and the water-soluble or water-dispersible, non-IR-sensitive compound that has a heterocyclic moiety with a quaternary nitrogen in the 1-position of the heterocyclic ring. Thus, such solutions contain no other compounds that have a meaningful effect on development.

Generally, a processing solution is applied to the imaged precursor by rubbing or wiping the outer layer with an applicator containing the processing solution. Alternatively, the imaged precursor can be brushed with the processing solution or its can be applied by spraying the outer layer with sufficient force to remove the exposed regions. Still again, the imaged precursor can be immersed in the processing solution. These development processes can be carried out in suitable developing processors or equipment using standard residence times and recirculation and replenishment rates. Excess processing solution can be removed using a squeegee or nip rollers.

Following this off-press development, the imaged element can be rinsed with water and dried in a suitable fashion. The dried element can also be treated with a conventional gumming solution (preferably gum arabic). In addition, a post-bake operation can be carried out, with or without a blanket exposure to UV or visible radiation. Alternatively, a post-UV floodwise exposure (without heat) can be used to enhance the performance of the imaged element.

In other embodiments, the processing solution is designed to both develop and provide a protective layer as a gumming solution over the lithographic printing plate and a further gumming step is omitted. Such processing solutions generally include one or more anionic surfactants or a hydrophilic film-forming polymer. For example, the processing solution can include at least one anionic surfactant is present in an amount of from about 3 to about 30 weight %, and this anionic surfactant can be an alkyldiphenyloxide disulfonate. This simplified processing solution can be provided in diluted or concentrated form. The amounts of components described below refer to amount in the diluted processing solution. However, it is to be understood that concentrated processing solutions can be used and the amounts of various components (such as the anionic surfactants) would be correspondingly increased.

In addition, these processing solutions can have one or more anionic surfactants, hydrophilic film-forming polymers, or both, as the only essential components, even though optional components (described below) can be present if desired.

Useful anionic surfactants include those with carboxylic acid, sulfonic acid, or phosphonic acid groups (or salts thereof). Anionic surfactants having sulfonic acid (or salts thereof) groups are particularly useful. For example, anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphate alkylester, salts of alkylsulfuric esters, sulfuric esters of polyoxyethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhdyride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyldiphenyloxide, ammonium or potassium perfluoroalkylsulfonate and sodium dioctylsulfosuccinate.

The one or more anionic surfactants are generally present in an amount of at least 1 weight %, and typically from about 1 to about 45 weight %, or from about 3 to about 30 weight % (based on the weight of the gum).

Two or more anionic surfactants ("first", "second", etc.) can be used in combination. In such mixtures, a first anionic surfactant, such as an alkyldiphenyloxide disulfonate, can be present generally in an amount of at least 1 weight % and typically from about 3 to about 30 weight %. A second surfactant can be present (same or different from the first anionic surfactant) in a total amount of at least 0.1 weight %, and typically from about 2 to about 30 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The processing solutions can also include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the gum onto the printing plate surface, such as a nonionic polyglycol. These nonionic surfactants can be present in an amount of up to 10 weight %, but at usually less than 2 weight %.

Other optional components of the processing solution include inorganic salts (such as those described in [0032] of U.S. Patent Application 2005/0266349, noted above), wetting agents (such as a glycol), a metal chelating agents, antiseptic agents, anti-foaming agents, ink receptivity agents (such as those described in [0038] of US '349), and viscosity increasing agents as noted above. The amounts of such components are known in the art. Calcium ion chelating agents are particularly useful, including but not limited to, polyaminopoly-carboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof. Organic amines can also be included. A chelating agent can be present in the gum in an amount of from about 0.001 to about 1 weight %.

Generally, the simplified processing solution is applied to the imaged precursor by rubbing, spraying, jetting, dipping, coating, or wiping the outer layer with the gum or a roller, impregnated pad, or applicator containing the processing solution. For example, the imaged precursor can be brushed with the processing solution or it can be poured on or applied by spraying the outer layer with sufficient force to remove the exposed regions using a spray nozzle system as described for example in [0124] of EP 1,788,431A2 (noted above). Still again, the imaged precursor can be immersed in the gum and rubbed by hand or with an apparatus.

The processing solution can also be applied in a gumming unit (or gumming station) that has at least one roller for rubbing or brushing the printing plate while the processing solution is applied during development. By using such a gumming unit, the exposed regions of the layer(s) can be removed from the substrate more completely and quickly. The processing solution can be collected in a tank and used several times, and replenished if necessary from a reservoir of processing solution.

Following off-press development, a postbake operation can be carried out, with or without a blanket or floodwise exposure to UV or visible radiation. The imaged and developed lithographic printing plate can be baked in a postbake operation to increase run length. Baking can be carried out, for example at from about 170° C. to about 240° C. for from about 7 to about 10 minutes, or at about 120° C. for 30 minutes. Alternatively, a blanket UV or visible radiation exposure can be carried out, without a postbake operation.

Printing can be carried out by applying a lithographic ink and fountain solution to the printing surface of the lithographic printing plate provided by this invention. The fountain solution is taken up by the non-imaged regions, that is, the surface of the hydrophilic substrate revealed by the imaging and development steps, and the ink is taken up by the imaged (non-removed) regions of the imaged layer(s). The ink is then transferred to a suitable receiving material (such as cloth, paper, metal, glass, or plastic) to provide a desired impression of the image thereon. If desired, an intermediate "blanket" roller can be used to transfer the ink from the printing plate to the receiving material. The printing plates can be cleaned between impressions, if desired, using conventional cleaning means.

The present invention provides at least the following embodiments and combinations thereof:

1. A lithographic processing solution for processing infrared radiation-sensitive, positive-working lithographic printing plate precursors, the lithographic processing solution having a pH of 12 or less and comprising at least 0.001 weight % and up to and including 1 weight % of a water-soluble or water-dispersible, non-IR-sensitive compound that has a heterocyclic moiety with a quaternary nitrogen in the 1-position of the heterocyclic ring, and having one or more electron donating substituents attached to the heterocyclic ring, at least one of which electron donating substituents is attached in the 2-position.

2. The processing solution of embodiment 1 wherein the water-soluble or water-dispersible compounds as a dialkylaminophenyl or 3-indolyl group in the 2-position of the heterocyclic ring.

3. The processing solution of embodiment 1 or 2 comprising one or more of the following compounds: Thioflavine T, Astrazon Orange G, and Basic Violet 16.

4. The processing solution of any of embodiments 1 to 3 having a pH of from 8 to 12.

5. The processing solution of any of embodiments 1 to 4 having a pH of from 8.5 to 11.5.

6. The processing solution of any of embodiments 1 to 5 further comprising one or more of the following: anionic or nonionic surfactants, alkanolamines, organic solvents, organic phosphonic acids or polycarboxylic acids or salts thereof that are different from the anionic surfactant, and hydrophilic film-forming polymers.

7. The processing solution of embodiment 6 that comprises at least 0.01 weight % of an alkanolamine, an organic phosphonic acid or polycarboxylic acid or salt thereof that is different from the anionic surfactant, or a hydrophilic film-forming polymer.

8. The processing solution of any of embodiments 1 to 7 that comprises up to and including 8 weight % of one or more organic solvents.

9. The processing solution of any of embodiments 1 to 8 that is free of silicates and metasilicates.

10. The processing solution of any of embodiments 1 to 9 that has a pH of from 8.5 to 11.5, and comprising from about 0.1 to about 0.8 weight % of one or more of Thioflavin T, Astrazon Orange G, and Basic Violet 16, the processing solution being essentially free of silicates and metasilicates, and further comprising from about 0.1 to about 5 weight % of an alkanolamine, organic phosphonic acid or polycarboxylic acid or salt thereof that is different from an anionic surfactant, an anionic or nonionic surfactant, or a hydrophilic film-forming polymer, or mixtures thereof.

11. The processing solution of embodiment 1 that consists essentially of a carbonate, organic solvent, and the water-soluble or water-dispersible, non-IR-sensitive compound that has a heterocyclic moiety with a quaternary nitrogen in the 1-position of the heterocyclic ring.

12. The processing solution of embodiment 11 that further includes an organic amine having a pKa greater than 9 and a boiling point greater than 150° C.

13. A method of providing a lithographic printing plate comprising:
  A) imagewise exposing a positive-working, infrared radiation-sensitive lithographic printing plate precursor having a hydrophilic substrate and a surface layer comprising a phenolic polymeric binder, to provide exposed and non-exposed regions in the surface layer, and
  B) processing the imagewise exposed precursor with the processing solution of any of embodiments 1 to 12 to remove the exposed regions of the surface layer, and thereby providing a lithographic printing plate.

14. The method of embodiment 13 wherein the surface layer of the lithographic printing plate precursor comprises a polymeric binder having pendant acidic groups.

15. The method of embodiment 13 or 14 wherein the surface layer of the lithographic printing plate precursor wherein the phenolic polymeric binder comprises pendant carboxylic acid groups.

16. The method of any of embodiments 13 to 15 wherein the surface layer of the lithographic printing plate precursor comprises an infrared radiation absorbing compound.

17. The method of any of embodiments 13 to 16 wherein the surface layer is directly disposed on the hydrophilic substrate.

18. The method of any of embodiments 13 to 16 wherein the positive-working lithographic printing plate precursor comprises an inner layer disposed on the hydrophilic substrate and the surface layer disposed on the inner layer as an outer surface layer.

19. The method of embodiment 18 wherein the inner layer comprises an infrared radiation absorbing compound.

20. The method of any of embodiments 13 to 19 wherein imagewise exposing is carried out using a laser at a wavelength of from about 700 to about 1400 nm.

21. The method of any of embodiments 13 to 20 further comprising rinsing and gumming the lithographic printing plate after processing step B.

22. The method of any of embodiments 13 to 21 wherein processing step B both develops and provides a protective layer as a gumming solution over the lithographic printing plate and a further gumming step is omitted.

23. The method of any of embodiments 13 to 22 wherein the processing solution further comprises one or more anionic surfactants or a hydrophilic film-forming polymer.

24. The method of embodiment 23 wherein at least one anionic surfactant is present in an amount of from about 3 to about 30 weight % and this anionic surfactant is an alkyl-diphenyloxide disulfonate.

25. The method of any of embodiments 13 to 24 further comprising:
C) mechanically removing excess processing solution from the lithographic printing plate after steps A and B, with optional drying.

26. The method of embodiment 25 wherein the excess processing solution is removed using a squeegee or nip rollers.

27. The method of embodiment 25 or 26 further comprising:
D) without removing the protective coating, using the lithographic printing plate after step C for printing an image using a lithographic printing ink.

The following examples are provided to illustrate the practice of this invention but they are not meant to be limited in any manner.

The following materials were used in the Examples:

DEK represents diethyl ketone.

PM represents propylene glycol methyl ether (Dow Chemical).

Dow PMA represents 1-methoxy-2-propyl acetate.

BLO represents γ-butyrolactone.

Solvent Mixture A is a mixture of MEK:PM:BLO:H$_2$O:Dioxalane at a weight ratio 45/20/10/10/15.

Solvent Mixture B is a mixture of DEK:Dow PMA at a weight ratio 92:8.

Byk 307 is a polyethoxylated dimethylpolysiloxane copolymer that is available from Byk Chemie (Wallingford, Conn.).

Substrate A is a 0.3 mm gauge aluminum sheet that had been electrograined, anodized, and subjected to treatment with poly(vinyl phosphonic acid).

D11 is a triarylmethane dye (CAS 433334-19-1).

Ethyl violet is assigned C.I. 42600 (CAS 2390-59-2, $\lambda_{max}$=596 nm) and has a formula of p-(CH$_3$CH$_2$)$_2$NC$_6$H$_4$)$_3$C$^+$Cl$^-$.

IR Dye A is represented by the following formula and can be obtained from Eastman Kodak Company (Rochester, N.Y.):

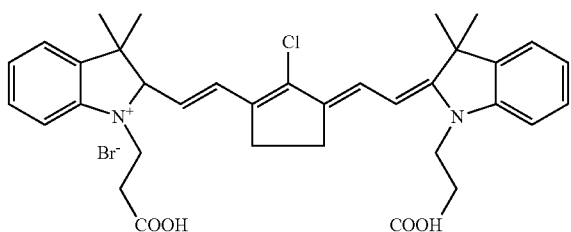 [SMILES: CC1(C)/C(=C\C=C2/CCC(/C=C/C3[NH+](CCC(=O)O)c4ccccc4C3(C)C)=C2Cl)N(CCC(=O)O)c2ccccc21 ; [Br-]]

Polymer A was comprised of recurring units derived from 5-methacrylamido-1,2,3,4-tetrazole/methacrylic acid/N-methoxymethyl methacrylamide/N-phenyl maleimide/acrylonitrile 18.8/5.5/10.6/21.3/43.8 wt. % ratio with an acid number of 104.

Polymer B is an acidic novolak based on SPN562 (phenolic groups etherified with chloroacetic acid); theoretical AN=70, Mw=5600. SPN562 is a 44% solution of m-cresol novolak from AZ Chemicals, Germany. This polymer can be prepared as described in U.S. Pat. No. 7,582,407 (Savariar-Hauck et al.).

Polymer C is a polyurethane made from dimethylolpropinic acid/bis[4-(2-hydroxyethoxy)phenyl]sulfone/hydroxy terminated fluorinated polyether/4,4'-diphenylmethane diisocyanate/hexandiol with theoretical AN of 62 (0.5/0.15/0.025/1.0/0.39 molar ratio). This polymer can be prepared as described in U.S. Patent Application Publication 2009/208869 (Kamiya et al.).

980 Developer has a pH of 10, is available from Eastman Kodak Company, and contain diethanolamine.

Developer A is 980 Developer further containing 0.01% Thioflavin T.

Developer B is 980 Developer further containing 0.02% Thioflavin T.

Developer C is 980 Developer further containing 0.04% Thioflavin T.

Developer D is 980 Developer further containing 0.02% Astrazon Orange G MEK represents methyl ethyl ketone.

Polymer MN3 was derived from PVA with 2% original acetate and its free OH groups were converted to acetals of butyral aldehyde and 5-nitro-salicylic aldehyde at 35% and 50%, respectively.

LB9900 is a resole resin that was obtained from Hexion AG.

IR Dye 50094 is an infrared radiation absorbing dye ($\lambda_{max}$=813 nm) that was obtained from FEW Chemicals (France).

Crystal Violet is C.I. 42555, Basic Violet 3 with $\lambda_{max}$=588 nm.

Sudan Black is a neutral azo dye (C.U. 26150).

4-DMABA represents 4-(dimethylamino)benzoic acid.

Polyfox® PF 652 is a surfactant (Omnova).

Polymer MN1 was derived from PVA with 2% original acetate and its free OH groups were converted to acetals of butyral aldehyde and 5-nitro-salicylic aldehyde at 25% and 50%, respectively.

Invention Examples 1-5 and Comparative Examples 1-4

Multilayer Positive-working Precursor Processing

Positive-working lithographic printing plate precursors were prepared as follows:

Bottom Layer A was obtained by coating a solution prepared by dissolving 2.3 g of Polymer A, 0.15 g of IR Dye A, and 0.038 g of D11 in 37.5 g of Solvent Mixture A onto Substrate A and drying at 135° C. for 45 seconds to provide a dry coating weight of 1.35 g/m$^2$.

Top layer A formulation was prepared by dissolving 1.6 g of Polymer B, 0.71 g of Polymer C, 0.007 g of Ethyl Violet, and 0.003 g of Byk® 307 in 37 g of Solvent Mixture B.

Top layer B formulation was prepared by dissolving 2.5 g of Polymer B, 0.007 g of Ethyl Violet, and 0.003 g of Byk® 307 in 37 g of Solvent Mixture B.

Top layer C formulation was prepared by dissolving 2.5 g of Polymer C, 0.007 g of Ethyl Violet, and 0.003 g of Byk® 307 in 37 g of Solvent Mixture B.

Lithographic printing plate precursor A was prepared by coating Top Layer A over Bottom Layer A to provide a top layer with a coating weight of 0.58 g/m$^2$.

Lithographic printing plate precursor B was prepared by coating Top Layer B over Bottom Layer A to give a top layer with a coating weight of 0.55 g/m$^2$.

Lithographic printing plate precursor C was prepared by coating Top Layer C over Bottom Layer A to give a top layer with a coating weight of 0.55 g/m$^2$.

All of the resulting lithographic printing plate precursors having two imaging layers were conditioned for 5 minutes at 60° C. After cooling the precursors to room temperature, they were evaluated for their performance. The results for precursors A, B, and C are tabulated below in TABLE I through III, respectively.

Performance Evaluations:

Developer Resistance (Soak Test):

To assess the resistance of the printing plate precursors to developers, drops of a developer kept at 25° C. were placed on the non-imaged element at 10 second time intervals and the developer was then wiped off after 120 seconds. The time at which the first visible attack of the coating was seen, and the time for complete dissolution were noted.

Drop Test:

To assess the speed of development, the lithographic printing plate precursors were imaged at 10 W/360 rpm (66 mJ/cm$^2$). Drops of developer kept at 25° C. were placed on the imaged precursors at 2 second intervals and rinsed off after 20 seconds. The printing plates were then inked, rinsed, and dried. The time required to obtain a clean background, denoted as the Drop Test was noted for each of the developers as shown in TABLE I through III below.

Photospeed and Ridges:

To assess the photospeed, Lithographic printing plate precursor A was imaged with test patterns comprising solids and an 8×8 checkerboard pattern at 4 W to 16 W in steps of 1 W using a Kodak Quantum 800 imagesetter (39 to 102 mJ/cm$^2$). The imaged precursors were developed with developers in a dish for a 10 second immersion and 10 seconds wiping at 25° C. and evaluated for Clear Point and image attack that is visible as ridges in the surface coating. The results are also shown in the TABLES below.

TABLE II-continued

|  | Comparative 2 Example (980 Developer) | Invention Example 5 |
|---|---|---|
| Drop Test | 4 seconds | 4 seconds |
| Image Attack (Ridges?) | Strong | Very slight |
| Clear Point | 53 mJ/cm$^2$ | 53 mJ/cm$^2$ |
| Regular Exposure mJ/cm$^2$ |  | 66 mJ/cm$^2$ |
| 50% Dot at regular Exposure (8 × 8 at 66 mJ/cm$^2$) | 45.9 | 48.2 |

The results in TABLE II show that similar improvement of plate properties were seen with the Lithographic printing plate precursor B in which the top layer comprised polymeric binder with phenolic moieties.

TABLE III

|  | Comparative Example 3 (980 Developer) | Comparative Example 4 (Developer B) |
|---|---|---|
| Soak Test (First attack/completely dissolved) | 20 seconds/30 seconds | 20 seconds/30 seconds |
| Drop Test | 4 seconds | 4 seconds |
| Image Attack (Ridges?) | Strong | Strong |
| Clear Point | 53 mJ/cm$^2$ | 53 mJ/cm$^2$ |
| Regular Exposure mJ/cm$^2$ | 66 mJ/cm$^2$ | 66 mJ/cm$^2$ |
| 50% Dot at regular Exposure (8 × 8 at 66 mJ/cm$^2$) | 48.9 | 49.0 |

The results in TABLE III show that when the top layer polymeric binder did not comprise phenolic groups and only carboxylic groups, there was minimal advantage for the inclusion of Thioflavin T in the developer as image attack was visible in both cases.

The results shown above in TABLES I to III show that the developers (processing solutions) of the present invention can

TABLE I

|  | Comparative Example 1 (980 Developer) | Invention Example 1, (Developer A) | Invention Example 2, (Developer B) | Invention Example 3, (Developer C) | Invention Example 4, (Developer D) |
|---|---|---|---|---|---|
| Soak Test | 20 seconds/35 seconds | 35 seconds/45 seconds | 50 seconds/60 seconds | 75 seconds/105 seconds | 90 seconds/105 seconds |
| Drop Test | 4 seconds | 4 seconds | 4 seconds | 4 seconds | 4 seconds |
| Image Attack (Ridges?) | Yes | Slight | None | None | None |
| Clear Point | 53 mJ/cm$^2$ | 53 mJ/cm$^2$ | 53 mJ/cm$^2$ | 53 mJ/cm$^2$ | 53 mJ/cm$^2$ |
| Reg Exposure (mJ/cm$^2$) | 66 mJ/cm$^2$ | 66 mJ/cm$^2$ | 66 mJ/cm$^2$ | 66 mJ/cm$^2$ | 66 mJ/cm$^2$ |
| 50% Dot at regular Exposure (8 × 8 at 66 mJ/cm$^2$) | 48.5 | 48.5 | 49.0 | 49.7 | 49.8 |

These results show that the 980 Developer also containing Thioflavin T or Astrazon Orange G provided the best image protection, free of ridges, and improved dot size without any loss of developability and photospeed of the Lithographic printing plate precursor A.

TABLE II

|  | Comparative 2 Example (980 Developer) | Invention Example 5 |
|---|---|---|
| Soak Test (first attack/completely dissolved) | 20 seconds/30 seconds | 35 seconds/55 seconds | be used to advantage for processing lithographic printing plate precursors having top layers with polymeric binders having phenolic groups.

Invention Examples 6-11 and Comparative Examples 5-6

Single-Layer Precursor Processing

These Invention Examples demonstrate the practice of this invention to use Thioflavin T or Astrazon Orange G in the processing solution to develop various single-layer lithographic printing plate precursors. They are compared to two Comparative Examples that utilize developers outside the present invention.

The Lithographic Printing Plate Precursors:

Plate D: single-layer positive-working precursor having an outer surface layer prepared from the following coating formulation:

| | |
|---|---|
| 0.914 g | Polymer MN3 |
| 0.122 g | LB9900 (49% in PM) |
| 0.030 g | IR Dye S0094 |
| 0.024 g | Crystal Violet |
| 0.024 g | Sudan Black |
| 0.144 g | 4-DMABA |
| 0.036 g | Polyfox ® PF 652 (10% in PM) |
| 8.88 g | PM |
| 4.83 g | MEK |

Plate E: a single-layer positive-working precursor having an outer surface layer prepared from the following coating formulation:

| | |
|---|---|
| 0.443 g | Polymer MN1 |
| 0.195 g | LB9900 (49% in PM) |
| 0.016 g | IR Dye S0094 |
| 0.013 g | Crystal Violet |
| 0.013 g | Sudan Black |
| 0.058 g | 4-DMABA |
| 0.019 g | Polyfox ® PF 652 (10% in PM) |
| 4.67 g | PM |
| 2.58 g | MEK |

The following Comparative Example developers were used:

Developer E (used with Plate D) containing 1.5% $K_2CO_3$ in water.

Developer F (used with Plate E) containing 1% $K_2CO_3$, 1.5% benzyl alcohol, and 1% 2-butoxy ethanol in water.

The following Invention Example developers were used:

Developer G: (used with Plate D) containing 1.5% $K_2CO_3$ and 0.02% Thioflavin T in water.

Developer H (used with Plate D) containing 1.5% $K_2CO_3$ and 0.01% Thioflavin T in water.

Developer I (used with Plate D) containing 1.5% $K_2CO_3$ and 0.001% Thioflavin T in water.

Developer J (used with Plate D) containing 1.5% $K_2CO_3$ and 0.01% Astrazon Orange G in water.

Developer K (used with Plate E) containing 1% $K_2CO_3$, 1.5% benzyl alcohol, 1% 2-butoxy ethanol, and 0.01% Thioflavin T in water.

Developer L (used with Plate E) containing 1% $K_2CO_3$, 1.5% benzyl alcohol, 1% 2-butoxy ethanol, and 0.02% Thioflavin T in water.

Both lithographic printing plate precursors (Plate D and Plate E) were exposed on a Kodak® Lotem 400 Quantum imager at 150 mJ/cm². All development steps were carried out at room temperature of 22° C.

The drop test described above for Invention Example 4 was used. This led to longer development times needed compared with processing the imaged precursor in a table top container. The developers were used immediately after dissolving Astrazon Orange G or Thioflavin T in the solution.

The Developer Resistance described above for Invention Example 4 was also used.

To evaluate the lithographic printing plate precursors, the cyan density loss (CDL) was measured at the time needed to obtain a Clearing Point (CP). The results of processing imaged Plate A are shown below in TABLE IV.

TABLE IV

| | Comparative Example 5 (Plate D and Developer E) | Invention Example 6 (Plate D and Developer G) | Invention Example 7 (Plate D and Developer H) | Invention Example 8 (Plate D and Developer I) | Invention Example 9 (Plate D and Developer J) |
|---|---|---|---|---|---|
| Time to first attack | 20 seconds | — | — | 1 minute and 30 seconds | 50 seconds |
| Time to obtain Clear Point | 5 minutes and 30 seconds | No Clear Point and no attack signs also at imaged areas even after 5 minutes and 40 seconds | No Clear Point and no attack signs also at imaged areas even after 7 minutes and 40 seconds | 7 minutes | 7 minutes and 30 seconds |
| CDL at Clear Point time | 15% | — | — | 64% | 63% |

The results in TABLE IV show (Invention Examples 6 and 7) that at 0.01 weight % or 0.02 weight % of Thioflavin T the imaged area was not easily developed even after more than 7 minutes. Plate D may be developable with lower amounts of Thioflavin T or by using different compounds according to this invention. Invention Example 8 shows that adding even a very small amount of 0.001 weight % of Thioflavin T to a 1.5 weight % potassium carbonate solution in water provided dramatic inhibition, leading to an increased first attack time (see Invention Example 8). Therefore, to allow precursor development, a very low concentration of Thioflavin T can be used with success (0.001 weight % in Invention Example 8). However, the time needed to obtain a Clearing Point (CP) increased significantly (see Invention Example 8). Moreover, very high CDL at the Clear Point (CP) time was found (64% in Invention Example 8). This indicates that when a simple developer based only on potassium carbonate in water was used adding Thioflavin T has marginal effect in this particular embodiment. The same was observed for the use of Astrazon Orange G (Invention Example 9). In addition, Thioflavin T exhibited much stronger inhibition than Astrazon Orange G. Therefore, Thioflavin T was best with Plate E (TABLE V below).

TABLE V

| | Comparative Example 6 (Plate E and Developer F) | Invention Example 10 (Plate E and Developer K) | Invention Example 11 (Plate E and Developer L) |
|---|---|---|---|
| Time to first attack | 5 seconds | 5 seconds | 1 minute and 20 seconds |
| Time to obtain Clear Point | 2 minutes and 35 seconds | 3 minutes and 30 seconds | 4 minutes and 40 seconds |
| CDL at Clear Point time | 32% | 30% | 5% |

The results in TABLE V show that adding 0.01 weight % of Thioflavin T to a 1% potassium carbonate, 1% 2-butoxy ethanol and 1.5% benzyl alcohol solution in water does not increase the time for the first visual coating attack. Moreover, the time to obtain Clear Point (CP) is increased and CDL at CP time does not decrease (see Invention Example 10). In contrast, much better results were obtained when a higher concentration of Thioflavin T was used. Thus, adding 0.02 weight % of Thioflavin T (Invention Example 11) led to a significant increase in the time needed for the first visual coating attack. While in this case the time to obtain CP is also increased, the CDL at CP time is very low (5% in Invention Example 11). This indicates that utilizing Thioflavin T at a high enough concentration (0.02 weight % in Invention Example 11) in a potassium carbonate solution containing an organic solvent, development is enhanced. It was observed that the use of Thioflavin T inhibited the plate coating attack to a much higher extent than it inhibited precursor development.

The results obtained for these Invention and Comparative Examples indicate that Thioflavin T was found to be a strong inhibitor and is more efficient and useful than Astrazon Orange G for the precursors that were tested. This does not mean, however, that Astrazon Orange G may not be useful during development of other lithographic printing plate precursors.

However, when a simple developer based only on potassium carbonate in water was used, merely adding a low concentration of Thioflavin T had little beneficial effect on precursor development. However, when an organic solvent was included in the developer, the presence of Thioflavin T at a high enough concentration was beneficial for plate development. In this case Thioflavin T inhibited precursor coating attack to a much higher extent than it inhibited precursor development.

It is clear that one skilled in the art may need to find the optimum amount of the water-soluble or water-dispersible, non-IR-sensitive compound ("additive") to use in a particular developer to process a particular positive-working lithographic printing plate precursor. It is not expected that every combination of precursor, developer, and "additive" will provide optimum results, and some routine experimentation may be needed to find the best results for a given combination, using the teaching provided herein.

The invention has been described in detail with particular reference to certain preferred embodiments thereof, but it will be understood that variations and modifications can be effected within the spirit and scope of the invention.

The invention claimed is:

1. A method of providing a lithographic printing plate comprising:
   A) imagewise exposing a positive-working, infrared radiation-sensitive lithographic printing plate precursor having a hydrophilic substrate and a surface layer comprising a phenolic polymeric binder comprising pendant carboxylic acid groups, to provide exposed and non-exposed regions in the surface layer, and
   B) processing the imagewise exposed precursor with a processing solution to remove the exposed regions of the surface layer, and thereby providing a lithographic printing plate,
   wherein the processing solution:
   has a pH of 12 or less, and
   comprises at least 0.001 weight % and up to and including 1 weight % of a water-soluble or water-dispersible, non-IR-sensitive compound that has a heterocyclic ring with a quaternary nitrogen in the 1-position of the heterocyclic ring, and that has one or more electron donating substituents attached to the heterocyclic ring, at least one of which electron donating substituents is attached in the 2-position and the at least one of electron donating substituent comprises a dialkylaminophenyl or 3-indolyl group.

2. The method of claim 1 wherein the surface layer of the lithographic printing plate precursor comprises an infrared radiation absorbing compound.

3. The method of claim 1 wherein the surface layer is directly disposed on the hydrophilic substrate.

4. The method of claim 1 wherein the positive-working lithographic printing plate precursor comprises an inner layer disposed on the hydrophilic substrate and the surface layer disposed on the inner layer as an outer surface layer.

5. The method of claim 1 wherein imagewise exposing is carried out using a laser at a wavelength of from about 700 to about 1400 nm.

6. The method of claim 1 further comprising rinsing and gumming the lithographic printing plate after processing step B.

7. The method of claim 1 wherein processing step B both develops and provides a protective layer as a gumming solution over the lithographic printing plate and a further gumming step is omitted.

8. The method of claim 1 further comprising:
   C) mechanically removing excess processing solution from the lithographic printing plate after steps A and B, optionally followed with drying.

9. The method of claim 8 wherein the excess processing solution is removed using a squeegee or nip rollers.

10. The method of claim 7 further comprising:
    C) mechanically removing excess processing solution from the lithographic printing plate after steps A and B, with optional drying, and
    D) without removing the protective layer, using the lithographic printing plate after step C for printing an image using a lithographic printing ink.

11. The method of claim 1 wherein the processing solution has a pH of from 8 to 12.

12. The method of claim 1 wherein the processing solution has a pH of from 8.5 to 11.5.

13. The method of claim 1 wherein the processing solution further comprises one or more of the following: anionic or nonionic surfactants, alkanolamines, organic solvents, organic phosphonic acids or polycarboxylic acids or salts thereof that are different from the anionic surfactant, and hydrophilic film-forming polymers.

14. The method of claim 1 wherein the processing solution further comprises at least 0.01 weight % of an alkanolamine, an organic phosphonic acid or polycarboxylic acid or salt thereof that is different from the anionic surfactant, or a hydrophilic film-forming polymer.

15. The method of claim 1 wherein the processing solution comprises up to and including 8 weight % of one or more organic solvents.

16. The method of claim 1 wherein the processing solution is free of silicates and metasilicates.

17. The method of claim 1 wherein the processing solution consists essentially of a carbonate, organic solvent, and the water-soluble or water-dispersible, non-IR-sensitive compound that has a heterocyclic ring with a quaternary nitrogen in the 1-position of the heterocyclic ring.

* * * * *